United States Patent
Azdasht

(10) Patent No.: US 7,360,679 B2
(45) Date of Patent: Apr. 22, 2008

(54) METHOD FOR THE PRODUCTION OF A SOLDERED CONNECTION

(75) Inventor: Ghassem Azdasht, Berlin (DE)

(73) Assignee: Smart Pac GmbH Technology Services, Nauen (DE)

( * ) Notice: Subject to any disclaimer, the term of this patent is extended or adjusted under 35 U.S.C. 154(b) by 329 days.

(21) Appl. No.: 10/416,742

(22) PCT Filed: Sep. 10, 2002

(86) PCT No.: PCT/DE02/03365

§ 371 (c)(1),
(2), (4) Date: Oct. 29, 2003

(87) PCT Pub. No.: WO03/024653

PCT Pub. Date: Mar. 27, 2003

(65) Prior Publication Data

US 2004/0060971 A1   Apr. 1, 2004

(30) Foreign Application Priority Data

Sep. 14, 2001 (DE) ................. 101 45 420

(51) Int. Cl.
*B23K 31/02* (2006.01)
(52) U.S. Cl. .................. 228/179.1; 228/256; 228/260
(58) Field of Classification Search ............. 228/245, 228/246, 41, 180.22, 180.5, 256, 257
See application file for complete search history.

(56) References Cited

U.S. PATENT DOCUMENTS

| | | | |
|---|---|---|---|
| 4,828,886 A | 5/1989 | Hieber | |
| 5,193,738 A | 3/1993 | Hayes | |
| 5,364,011 A | 11/1994 | Baker et al. | |
| 5,605,276 A * | 2/1997 | Nagata | 228/257 |
| 5,810,988 A | 9/1998 | Smith, Jr. et al. | |
| 5,828,031 A | 10/1998 | Pattanaik | |
| 6,046,882 A * | 4/2000 | Pattanaik et al. | 29/878 |
| 6,264,090 B1 | 7/2001 | Muntz et al. | |
| 6,336,581 B1 * | 1/2002 | Tuchiya et al. | 228/33 |
| 6,543,677 B2 * | 4/2003 | Pattanaik et al. | 228/246 |
| 6,589,594 B1 * | 7/2003 | Hembree | 438/106 |
| 6,595,408 B1 * | 7/2003 | Cobbley et al. | 228/245 |
| 6,742,694 B2 * | 6/2004 | Satoh et al. | 228/41 |
| 2003/0070834 A1 * | 4/2003 | Tsuchiya et al. | 174/250 |
| 2004/0069758 A1 * | 4/2004 | Azdasht et al. | 219/121.85 |
| 2005/0045701 A1 * | 3/2005 | Shindo et al. | 228/246 |

FOREIGN PATENT DOCUMENTS

DE 36 37 631 C1 8/1987
JP 06 023 530 A 2/1994

OTHER PUBLICATIONS

P. Kasulke et al., filed Apr. 27, 1998, Solder Bumper SB$^2$, Electronics Manufacturing Technology.

* cited by examiner

*Primary Examiner*—Kiley Stoner
(74) *Attorney, Agent, or Firm*—McGlew and Tuttle, P.C.

(57) ABSTRACT

A method for the production of a soldered joint between at least two contact partners (22, 23) of a bonding arrangement (21), with a formed piece of solder material (27) being arranged at a distance to the bonding arrangement. The formed piece of solder material is at least partially melted off. The at least partially melted off formed piece of solder material being thrust against a bonding arrangement in such a way that both bonding partners are wetted in a bonding area to establish an electrically conductive bonding.

1 Claim, 3 Drawing Sheets ent, the formed piece of solder material is at least partially melted off and the at least partially melted off formed piece of solder material is thrust against the bonding arrangement in such a way that both contact partners are wetted to achieve an electrically conductive bond in a bonding area.

METHOD FOR THE PRODUCTION OF A SOLDERED CONNECTION

FIELD OF THE INVENTION

The present invention relates to a method for the production of a soldered joint between at least two contact partners of a bonding arrangement where a formed piece of solder material is arranged at a distance to the bonding arrangement, the formed piece of solder material is at least partially melted off and the at least partially melted off formed piece of solder material is thrust against the bonding arrangement in such a way that both contact partners are wetted to achieve an electrically conductive bond in a bonding area.

BACKGROUND OF THE INVENTION

U.S. Pat. No. 5,828,031 discloses a method for the production of a soldered joint between two contact partners of a bonding arrangement, with the contact partners being designed as contact surfaces that include a 90° angle. For the production of such a soldered joint, it is described to arrange a formed piece of solder material formed as a solder ball by means of a capillary between the two contact partners in such a way that the result is a contact between the two contact surfaces as well as the capillary. For this purpose, the solder ball is pressed against the contact surfaces by means of the capillary. Such contact must be maintained long enough until a melting of the solder ball by means of laser energy has effected a wetting of the contact surfaces and the resulting adhesive forces, which secure the solder material in the bonding position.

The aforementioned type of generation of the contact pressure between the solder ball and the contact surfaces requires that the capillary for the production of the soldered joint must be positioned directly in the area of the bonding arrangement. For one, this requires an extremely precise positioning of the capillary, and on the other hand, it requires a good accessibility of the bonding arrangement.

SUMMARY OF THE INVENTION

The invention is based on the problem of proposing a method for the production of a soldered joint between two contact partners of a bonding arrangement not arranged on the same plane, which requires on the one hand a low positioning effort for the positioning of the capillary, and on the other hand can be executed at a distance to the bonding arrangement, thus requiring lesser requirements with respect to the accessibility of the bonding arrangement.

In the method for the production of a soldered joint in accordance with the invention, a formed piece of solder material is arranged at a distance to the bonding arrangement and thrust or shot against the bonding arrangement following an at least partial melting off of the formed piece of solder material. This thrust motion or ballistic motion of the at least partially melted off formed piece of solder material is such that both contact partners are wetted at the impact or as a result of the impact on the contact partner(s). This can be effected in that both contact partners are impacted simultaneously or one contact partner is impacted first and the wetting of the second contact partner is effected as a result of the ricochet effect. In any case, the wetting of both contact partners results in an electrically conductive joint.

Suitable solder materials are not only conventional materials such as metallic solder alloys, for example, but principally all materials that enable an electrically conductive joint between the contact partners, such as conductive plastic materials, for example.

Compared to the known method, this therefore results in a lesser requirement with respect to the positioning precision of the capillary on the one hand and with respect to the accessibility of the bonding arrangement on the other hand, because a mechanical contact chain between the bonding arrangement, the formed piece of solder material and the capillary for the production of the soldered joint is no longer required. Rather, the at least partially melted off formed piece of solder material can be positioned in the area of the bonding arrangement without contact to the capillary. Depending on the geometrical conditions or, for example, even the composition of the solder material, the formed piece of solder material may be thrust and/or shot against the bonding arrangement when only partially melted off or completely melt off. It is essential only that both contact partners are wetted as a result of the impact of the solder material on at least one contact partner of the bonding arrangement.

A particularly advantageous method is thrusting the at least partially melted off formed piece of solder material into a contact gap developed between the contact partners of the bonding arrangement. In such application of the method, it is possible, depending on the development of the gap, to counteract the capillary force acting against the wetting of the entire contact surface of the bonding arrangement with the mass force of the solder material to achieve a dependable soldered joint even with bonding arrangements that are developed rather unfavorably.

Especially with a contact gap that is shaped more or less conically, as a result of the bonding arrangement, the application of the method enables a dependable soldered joint if the at least partially melted off formed piece of solder material is thrust into the direction of the bisector of the gap angle developed between the contact partners in the contact gap. The choice of thrust direction according to the bisector of the conical gap is especially advantageous if the contact partners to be wetted are developed as a surface with approximately equally sized contact surfaces.

With a conical development of the contact cap and contact partners being designed as differently sized contact surfaces, it is advantageous if the at least partially melted off formed piece of solder material is thrust into the contact gap along an axis that runs between the bisector of the angle and the larger of the two contact surfaces.

With a bonding arrangement of two contact surfaces arranged in parallel, it is especially advantageous to thrust the at least partially melted off formed piece of solder material into the direction of the center axis of the gap into the parallel gap developed between the contact surfaces of to the bonding arrangement.

In contact surfaces that are arranged relative to one another in this way and/or contact gaps developed in this way, such as is the case, for example, with a so-called flip-chip contacting of a semiconductor component such as a chip, on a substrate, the method thus enables in a first step a defined relative arrangement of the contacting substrates with oppositely arranged connecting surfaces at a precisely adjustable substrate distance and in a second step with precise adherence to the defined substrate distance, a contacting of the substrates by producing a soldered joint by means of a thrust application of the solder material in the contact gap developed between the contact surfaces of the substrates.

With a bonding arrangement comprised of a contact sleeve and a conducting wire running in the contact sleeve, it is advantageous to thrust the at least partially melted off formed piece of solder material into the direction of the run of the conducting wire in the implementation of the method. This application of the method appears especially advantageous when the substrate is assembled with electronic components in SMD technology where the connecting conductors of the components are assembled into the through plating of the substrate and soldered with said through plating.

With a bonding arrangement comprised of a contact surface and a wire conductor arranged on the contact surface, the wire conductor is forced into contact with the contact surface as a result of the thrust of the solder material on the wire conductor. In this way, it is also possible to do without a contact between the contact tool and the wire conductor in a wire conductor connection while establishing the connection.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
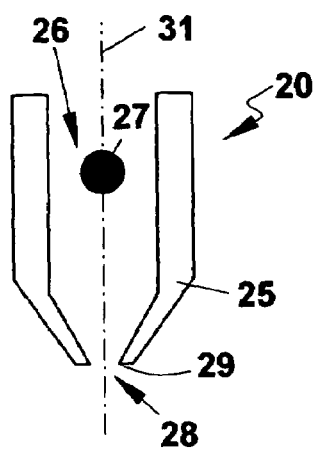
FIG. 1 is a principal representation of a step of the method in the implementation of the method for producing a soldered joint between two contact surfaces of a bonding arrangement forming a contact gap.

Referring to the drawings in particular, FIGS. 1 to 6 show a solder material application means 20 suitable for the implementation of the method as well as the application of the method for producing a soldered joint in a bonding arrangement 21 having contact partners that are designed as contact surfaces 22, 23 and arranged relative to one another such that they form a conical gap 24. In the present case, the angle $\alpha$ of the conical gap 24 is approximately 90°.

FIG. 1 shows the solder material application means 20 having a guide channel 26 developed in an application mouthpiece 25, which takes up to and guides the formed piece of solder material 27, which is designed in a ball-shape in the present case. The formed piece of solder material 27 is moved by the gravity or the active load, for example by compressed gas, into a funnel-shaped output area 28 of the guide channel 26 where it comes to bear on an opening edge 29 of the output area 28. In the present case, the opening edge 29 is developed like a valve seat and forms, together with the formed piece of solder material 27 arranged opposite thereof, an essentially fluid-tight closing of the output area 28. Because of the funnel-shaped design of the output area 28, an appropriate positioning of the application mouthpiece 25 above the bonding arrangement 21 enables a defined alignment of the formed piece of solder material 27 on a plane that runs essentially perpendicular to the longitudinal axis of the guide channel 26.

Figure 2:
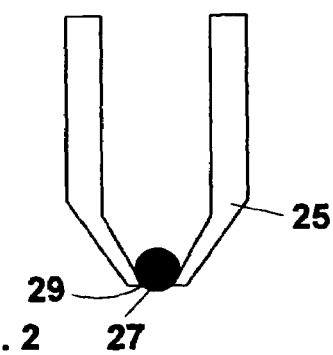
FIG. 2 is a principal representation of a step subsequent to the step of FIG. 1 in the implementation of the method for producing a soldered joint between two contact surfaces of a bonding arrangement forming a contact gap.

After the formed piece of solder material 27 has reached the guide channel 26 of the application mouthpiece 25, as shown in FIG. 1, it comes to bear on the opening edge 29 of the output area, as shown in FIG. 2.

Figure 3:
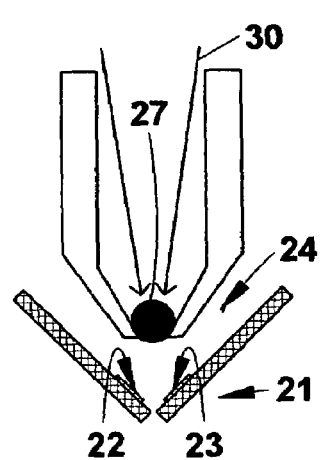
FIG. 3 is a principal representation of a step subsequent to the step of FIG. 2 in the implementation of the method for producing a soldered joint between two contact surfaces of a bonding arrangement forming a contact gap.
Figure 4:
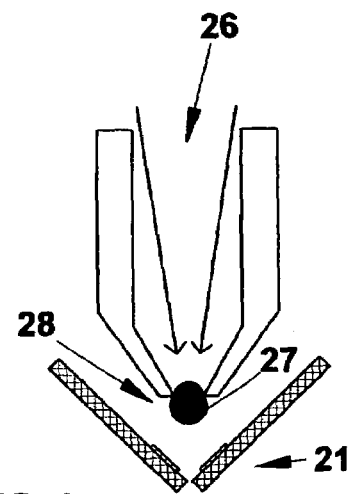
FIG. 4 is a principal representation of a step subsequent to the step of FIG. 3 in the implementation of the method for producing a soldered joint between two contact surfaces of a bonding arrangement forming a contact gap.

Following the positioning of the formed piece of solder material 27 relative to the bonding arrangement 21 shown in FIG. 3, the formed piece of solder material is loaded with energy, for example by means of laser energy, which effects an at least partial melting off of the formed piece of solder material 27.

A temporary or even constant fluid pressure in the guide channel 26 following the at least partial melting off of the formed piece of solder material 27, which is preferably generated by means of a protective gas, effects the ejection of the at least partially melted off formed piece of solder material 27 from the output area 28.

Figure 5:
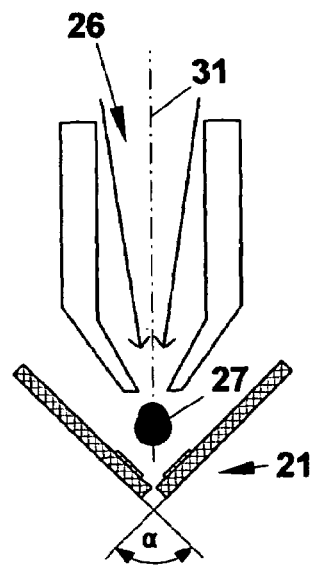
FIG. 5 is a principal representation of a step subsequent to the step in FIG. 4 in the implementation of the method for producing a soldered joint between two contact surfaces of a bonding arrangement forming a contact gap.

As shown in FIG. 5, the ejection process then effects a projectile movement of the at least partially melted off formed piece of solder material 27 into the direction of the bonding arrangement 21 along the center axis 31 of the guide channel 26, with the center axis 31 approximately coinciding with the bisector of the gap angle $\alpha$ in the example shown here.

Figure 6:
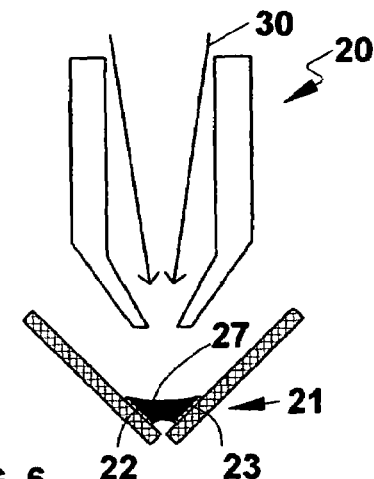
FIG. 6 is a principal representation of a step subsequent to the step of FIG. 5 in the implementation of the method for producing a soldered joint between two contact surfaces of a bonding arrangement forming a contact gap.

As shown in FIG. 6, the impact of the formed piece of solder material 27, which in the shown example was already completely melted off before the impact, results in a complete wetting of the contact surfaces 22, 23. The development of the wetting is enhanced by the kinetic energy of the impact.

In the case that the formed, piece of solder material 27 impacts the contact surfaces 22, 23 of the bonding arrangement 21 in only partially melted off condition, there is first an at least partial wetting of the contact surfaces 22, 23 corresponding to the portion of the melted off volume of the formed piece of solder material 27. In that case, a complete wetting of the contact surfaces 22, 23 can be ensured in that the formed piece of solder material 27 is repeatedly loaded with energy after the formed piece of solder material 27 has impacted the bonding arrangement 21 until a complete melt off has been achieved.

Figure 7:
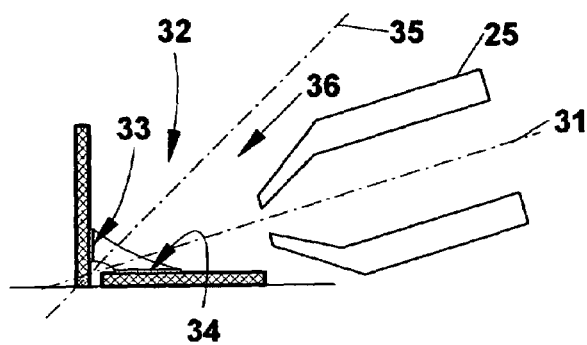
FIG. 7 is a view of a bonding arrangement forming a contact gap, with differently sized contact surfaces.

FIG. 7 shows how the method can be adapted to the specific geometrical conditions of a bonding arrangement 32, which has differently sized contact surfaces 33, 34, depending on the orientation of the center axis 31, which in the present case coincides with the ejection axis. To that end, the ejection axis is tilted in deviation from the bisector 35 of an angle of a conical gap 36 formed by the bonding arrangement 32 toward the larger contact surface 34 so that the impact of the at least partially melted off formed piece of solder material 27 results, in view of the wetting surface, in a different wetting that is appropriately adapted to the respective size of the contact surfaces 33, 34.

Figure 8:
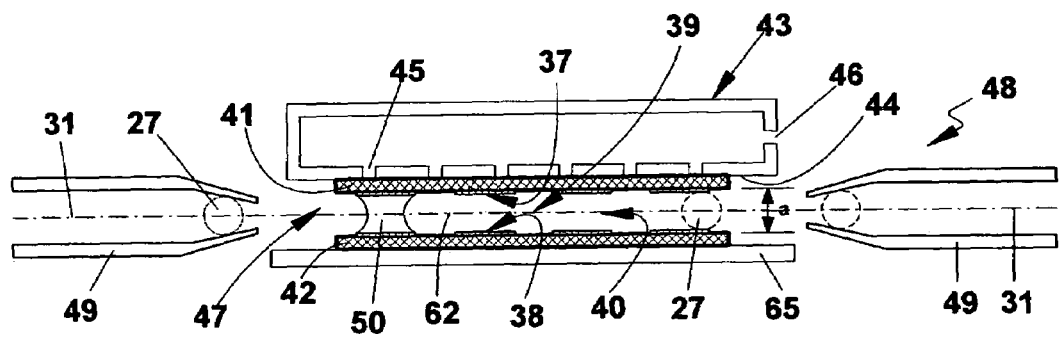
FIG. 8 is a side view of a particular arrangement using the method for producing a soldered joint between contact surfaces of the bonding arrangement forming a parallel gap.

FIG. 8 shows the application of the method for the production of a soldered joint between contact surfaces 37, 38 of a bonding arrangement 39 forming a parallel gap 40.

Figure 9:
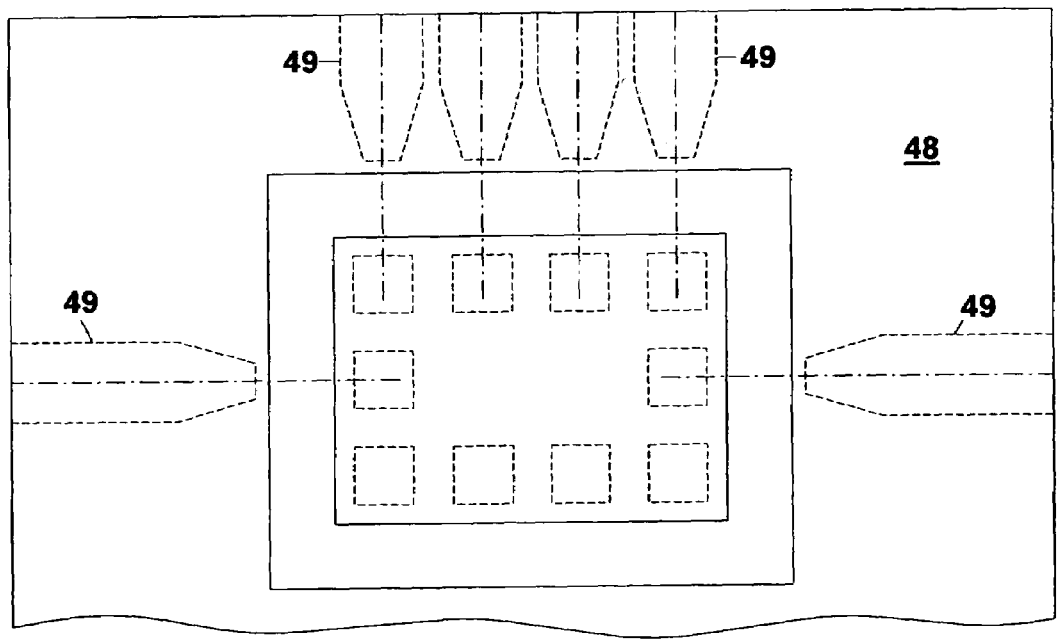
FIG. 9 is a top view of the arrangement shown in FIG. 8.

The application example shown in FIGS. 8 and 9 relates to the example of the bonding of a chip 41 with peripherally arranged contact areas 37 on a substrate 42 also having peripherally arranged contact surfaces 38. In the present case, the substrate 42 with the contact surfaces 38 facing the chip 41 is on a base 65. The chip 41 is arranged above the substrate 42 and at a defined distance "a" to said substrate, with the contact surfaces 37 of the chip being in an overlap with the associated contact surfaces 38 of the substrate. In said defined relative position relative to the substrate 42, the chip 41 is held by a negative pressure plate 43 that has suction openings 45 in its suction surface 44 and effects an adhesion of the chip 41 to the negative pressure plate 43 by means of a vacuum applied to the connection opening 46 of the negative pressure plate 43.

To produce soldered joints between the contact surfaces 37, 38 of the individual bonding arrangements 39, the substrate arrangement 47 comprised of the chip 41 and the substrate 42 is defined in its relative positioning as described earlier. Then, as is shown especially in FIG. 9, the substrate arrangement 47 is enclosed by a solder material application means 48 such that respective associated application areas 49 are assigned to the individual bonding arrangements 39. The respective structure of said application areas 49 corresponds to that of the solder material application means 20 shown in FIGS. 1 to 7. In that way, the center axes 31 of the application areas 49 are aligned essentially parallel and axial to the contact surfaces 37, 38, i.e., approximately coaxially to the gap center axis 62 of the bonding arrangements 39.

As already explained in detail above with reference to FIGS. 1 to 6, the at least partially melted off formed pieces of solder material 27 are ejected from said position, so that, following an impact of the at least partially melted off formed piece of solder material 27, as shown in FIG. 8 (right), the bonding surfaces 37, 38 are wetted to develop a soldered joint 50, as shown in FIG. 8 (left).

Figure 10:
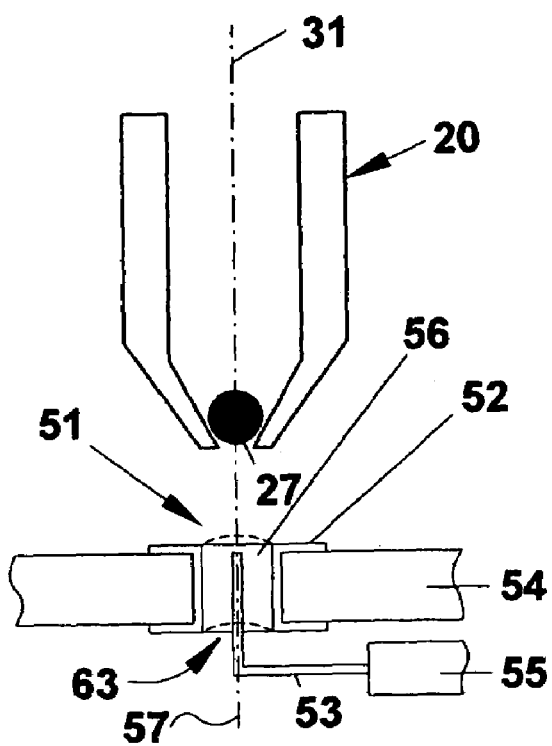
FIG. 10 is a view showing the application of the method for producing a soldered joint with a contact arrangement forming a ring gap.

FIG. 10 shows an application of the method for the production of a soldered joint with a bonding arrangement 51 comprised of a contact sleeve 52 and a wire conductor 53, which, together form a ring gap 63. The contact sleeve 52 may be a through-contacting, called "via" in technical jargon, in a substrate 54, into which a connecting conductor, designed as a wire conductor 53, of an electronic component such as a semiconductor component 55, for example, is inserted. The bonding arrangement between the semiconductor component 55 and the substrate 54 shown in FIG. 10 thus corresponds to the connections established in so-called SMD (surface mounted device) technology to generate component groups.

To produce a soldered joint 56, shown in FIG. 10 in dash-dot lines, in the ring gap 63 between the contact sleeve 52 and the wire conductor 53, the solder material application means 20 is positioned with the center axis 31 of the guide channel 26 relative to the contact sleeve 52 essentially such that the center axis 31 runs essentially coaxially to a center axis 57 of the contact sleeve 52. In the present case, the center axis 57 essentially coincides with the course of the wire conductor 53 in the contact sleeve 52.

Figure 11:
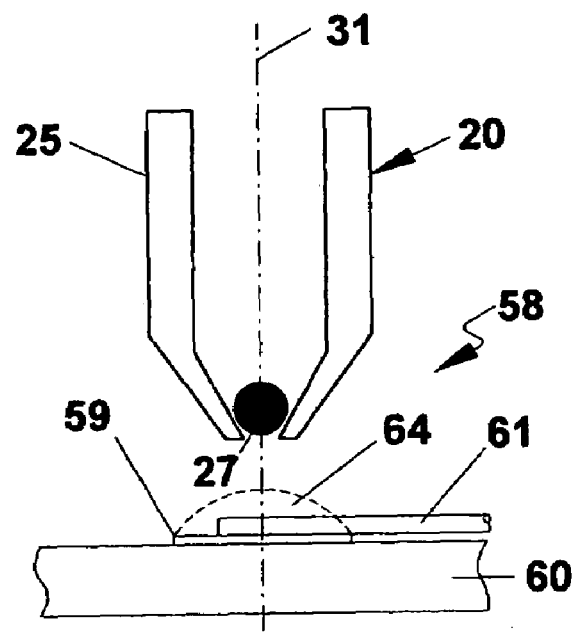
FIG. 11 is a view showing the application of the method for producing a soldered joint with a contact arrangement comprised of a contact surface and a wire conductor.

FIG. 11 shows the production of a soldered joint 64, shown in dash-dot lines, with a bonding arrangement 58 comprised of a contact surface 59 of a substrate 60 and a wire conductor 61. The bonding arrangement 58 is loaded with the at least partially melted off formed piece of solder material 27 from a position of the solder material application means 20 where the center axis 31 of the application mouthpiece 25, which coincides with the direction of ejection, intersects the wire conductor and is arranged transversely to the contact surface 59. This positioning of the application mouthpiece 25 results in an intermediate arrangement of the wire conductor 61 so that the wire conductor 61 is pressed against the contact surface 59 by the impact of the at least partially melted off formed piece of solder material and enables an essentially gap-free contact between the wire conductor and the contact surface 59.

While specific embodiments of the invention have been shown and described in detail to illustrate the application of the principles of the invention, it will be understood that the invention may be embodied otherwise without departing from such principles.

The invention claimed is:

1. A method for the production of a soldered joint between at least two contact partners of a bonding arrangement, the method comprising:

arranging a formed piece of solder material at a distance to the bonding arrangement;

melting off the formed piece of solder material at least partially;

ejecting the at least partially melted off formed piece of solder material from the location at a distance to the bonding arrangement comprised of two contact surfaces, each of said contact surfaces arranged on different substrates and arranged horizontally in parallel to provide a gap developed between the parallel contact surfaces of the bonding arrangement such that a wetting of both contact partners is effected to establish an electrically conductive connection in a bonding area of the bonding arrangement, wherein as a result of said step of ejecting, the at least partially melted off formed piece of solder material is thrust into the direction of a center axis of the gap.

* * * * *